United States Patent
Akerib

(10) Patent No.: US 9,558,812 B2
(45) Date of Patent: Jan. 31, 2017

(54) SRAM MULTI-CELL OPERATIONS

(71) Applicant: GSI Technology Inc., Sunnyvale, CA (US)

(72) Inventor: Avidan Akerib, Tel Aviv (IL)

(73) Assignee: GSI Technology Inc., Sunnyvale, CA (US)

( * ) Notice: Subject to any disclaimer, the term of this patent is extended or adjusted under 35 U.S.C. 154(b) by 0 days.

(21) Appl. No.: 15/146,908

(22) Filed: May 5, 2016

(65) Prior Publication Data

US 2016/0329092 A1 Nov. 10, 2016

Related U.S. Application Data

(60) Provisional application No. 62/157,162, filed on May 5, 2015.

(51) Int. Cl.
| | |
|---|---|
| *G11C 11/40* | (2006.01) |
| *G11C 11/419* | (2006.01) |
| *G11C 11/418* | (2006.01) |
| *G11C 8/10* | (2006.01) |
| *G11C 8/08* | (2006.01) |

(52) U.S. Cl.
CPC ............ *G11C 11/419* (2013.01); *G11C 11/418* (2013.01); *G11C 8/08* (2013.01); *G11C 8/10* (2013.01)

(58) Field of Classification Search
CPC .... G11C 11/418; G11C 11/419; G11C 7/1051; G11C 8/08; G11C 8/10
USPC ............... 365/156, 154, 189.11, 190, 230.06
See application file for complete search history.

(56) References Cited

U.S. PATENT DOCUMENTS

| | | | | |
|---|---|---|---|---|
| 4,831,591 | A | * 5/1989 | Imazeki | ............... G11C 7/1006 326/46 |
| 6,118,689 | A | 9/2000 | Kuo et al. | |
| 2002/0112137 | A1 | 8/2002 | Houston | |
| 2004/0156371 | A1 | 8/2004 | Kumar et al. | |
| 2010/0309740 | A1 | 12/2010 | Arsovski et al. | |
| 2011/0013442 | A1 | 1/2011 | Akerib et al. | |
| 2012/0033489 | A1 | 2/2012 | Song et al. | |
| 2012/0137060 | A1 | 5/2012 | Akerib et al. | |
| 2012/0140540 | A1* | 6/2012 | Agam | ...................... G11C 8/08 365/49.1 |
| 2014/0036564 | A1 | 2/2014 | De Santis et al. | |
| 2014/0185364 | A1 | 7/2014 | Iyer et al. | |
| 2015/0055402 | A1 | 2/2015 | Chen et al. | |

OTHER PUBLICATIONS

International Search Report for corresponding PCT application PCT/IB2016/052562 mailed on Aug. 18, 2016.

\* cited by examiner

*Primary Examiner* — Tan T. Nguyen
(74) *Attorney, Agent, or Firm* — Eitan, Mehulal & Sadot

(57) ABSTRACT

A multi-memory cell operator includes a non-destructive memory array, an activation unit and a multiple column decoder. The non-destructive memory array has first and second bit lines per column. The activation unit activates at least two cells in a column of the memory array at the same time thereby to generate multiple Boolean function outputs of the data and of complementary data of the at least two cells on the first bit line and different multiple Boolean function outputs of the data and of the complementary data on the second bit line. The multiple column decoder at least activates the first and second bit lines of multiple selected columns for reading or writing. The multiple column decoder also includes a write unit to write the output of the first bit line, the second bit line or both bit lines of the selected columns into the memory array.

20 Claims, 7 Drawing Sheets

|        | COL-A | | | COL-B | | | COL-C | |
|--------|-------|-------|---|-------|-------|---|-------|-------|
| CELL # | Q | Q' | | Q | Q' | | Q | Q' |
| 1 | 1 | 0 | | 0 | 1 | | 1 | 0 |
| 2 | 1 | 0 | | 0 | 1 | | 1 | 0 |
| 3 | 0 | 1 | | 0 | 1 | | 1 | 0 |
| 4 | 0 | 1 | | 0 | 1 | | 1 | 0 |
| 5 | 1 | 0 | | 0 | 1 | | 1 | 0 |
| 6 | 0 | 1 | | 0 | 1 | | 1 | 0 |
|  |  |  | |  |  | |  |  |
| BLQ | 0 | | | 0 | | | 1 | |
| BLQ' | | 0 | | | 1 | | | 0 |
|  | AND (Q) AND NOR (Q') | AND (Q') AND NOR (Q) | | AND (Q) AND NOR (Q') | AND (Q') AND NOR (Q) | | AND (Q) AND NOR (Q') | AND (Q') AND NOR (Q) |

FIG.4

SRAM MULTI-CELL OPERATIONS

CROSS REFERENCE TO RELATED APPLICATIONS

This application claims priority from U.S. provisional patent application 62/157,162, filed May 5, 2015, which is incorporated herein by reference.

FIELD OF THE INVENTION

The present invention relates to memory cells generally and to multi-cell operations in 6T SRAM memory arrays in particular.

BACKGROUND OF THE INVENTION

Memory arrays, which store large amounts of data, are known in the art. Over the years, manufacturers and designers have worked to make the arrays physically smaller but the amount of data stored therein larger.

Computing devices typically have one or more memory arrays to store data and a central processing unit (CPU) and other hardware to process the data. The CPU is typically connected to the memory array via a bus. Unfortunately, while CPU speeds have increased tremendously in recent years, the bus speeds have not increased at an equal pace. Accordingly, the bus connection acts as a bottleneck to increased speed of operation.

The evolving domains of big data and machine learning algorithms involve computation on large amount of data. Reading and writing data from and to memory during computation is CPU intensive and may take a long time to complete when the IO is a significant portion of the whole computation.

SUMMARY OF THE PRESENT INVENTION

There is provided, in accordance with a preferred embodiment of the present invention, a multi-memory cell operator includes a non-destructive memory array, an activation unit and a multiple column decoder. The non-destructive memory array has first and second bit lines per column. The activation unit activates at least two cells in a column of the memory array at the same time thereby to generate multiple Boolean function outputs of the data and of complementary data of the at least two cells on the first bit line and different multiple Boolean function outputs of the data and of the complementary data on the second bit line. The multiple column decoder at least activates the first and second bit lines of multiple selected columns for reading or writing.

Further, in accordance with a preferred embodiment of the present invention, the multiple column decoder also includes a write unit to write the output of the first bit line, the second bit line or both bit lines of the selected columns into the memory array.

Still further, in accordance with a preferred embodiment of the present invention, the multiple column decoder includes a pre-charger to precharge the first and second bit lines to a pre-defined pre-charge voltage prior to reading.

Moreover, in accordance with a preferred embodiment of the present invention, the multiple column decoder includes a charger to charge the first bit line of selected columns with a state value and the second bit line with a complementary value to the state value of selected columns for writing the state value to activated cells in the selected column and a pre-charger to precharge the first and second bit lines of non-selected columns to a pre-defined pre-charge voltage during writing.

Additionally, in accordance with a preferred embodiment of the present invention, the multiple column decoder includes an output unit to output the values on one or both of the first and second bit lines of selected the non-selected columns for reading during the writing.

Further, in accordance with a preferred embodiment of the present invention, the operator also includes a search unit to search through the data for cells having matched values to input values, to perform an operation on the matched values to generate processed values and to write the processed values back to their associated the cells.

Still further, in accordance with a preferred embodiment of the present invention, the cells are SRAM (Static Random Access Memory) cells, for example, 6 transistor SRAM cells.

Moreover, in accordance with a preferred embodiment of the present invention, the multiple column decoder also includes a calculator to perform in-memory calculations through multiple read operations and through writing the read results to other locations in the memory array, the results being used for later calculations.

Further, in accordance with a preferred embodiment of the present invention, the Boolean operations are NOR, NAND, AND and OR.

There is also provided, in accordance with a preferred embodiment of the present invention, a method for operating a memory array for computations. The method includes at the same time, activating at least two cells in a column of a non-destructive memory array having first and second bit lines per column thereby to generate multiple Boolean function outputs of data stored in the at least two cells and of complementary data of the at least two cells on the first bit line and different multiple Boolean function outputs of the data and of the complementary data on the second bit line. The method also includes activating the first and second bit lines of multiple selected columns for reading or writing.

Further, in accordance with a preferred embodiment of the present invention, the second activating also includes writing the output of the first bit line, the second bit line or both bit lines of the selected columns into the memory array.

Still further, in accordance with a preferred embodiment of the present invention, the second activating includes precharging the first and second bit lines to a pre-defined pre-charge voltage prior to reading.

Moreover, in accordance with a preferred embodiment of the present invention, the second activating includes charging the first bit line of selected columns with a state value and the second bit line with a complementary value to the state value of selected columns for writing the state value to activated cells in the selected column and precharging the first and second bit lines of non-selected columns to a pre-defined pre-charge voltage during writing.

Additionally, in accordance with a preferred embodiment of the present invention, the second activating includes outputting the values on one or both of the first and second bit lines of selected the non-selected columns for reading during the writing.

Further, in accordance with a preferred embodiment of the present invention, the method also including searching through the data for cells having matched values to input values, performing an operation on the matched values to generate processed values and writing the processed values back to their associated the cells.

Finally, in accordance with a preferred embodiment of the present invention, the second activating also includes performing in-memory calculations through multiple read operations and through writing the read results to other locations in the memory array, the results being used for later calculations.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 4 together are a truth table illustration of an exemplary set of operations in the SRAM memory array of FIG. 3;

Figure 1:
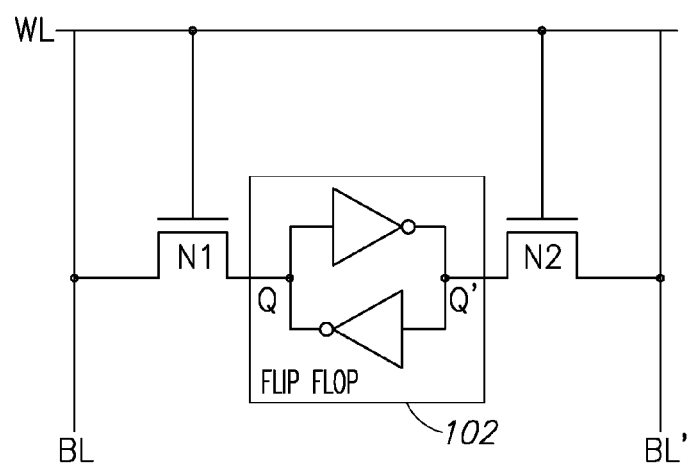
FIG. 1 is a diagram of a 6T SRAM memory cell.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicant has realized that the standard 6T SRAM (Static Random Access Memory) memory array may be used more efficiently by enabling concurrent multi cell operations rather than the single row access per computing cycle of standard 6T SRAM memory arrays.

In accordance with an embodiment of the present invention, multiple rows are accessed in each computation cycle, resulting in the ability to perform multiple cell operations, such as a multi-cell write operation and a multi-cell computation.

Figure 2:
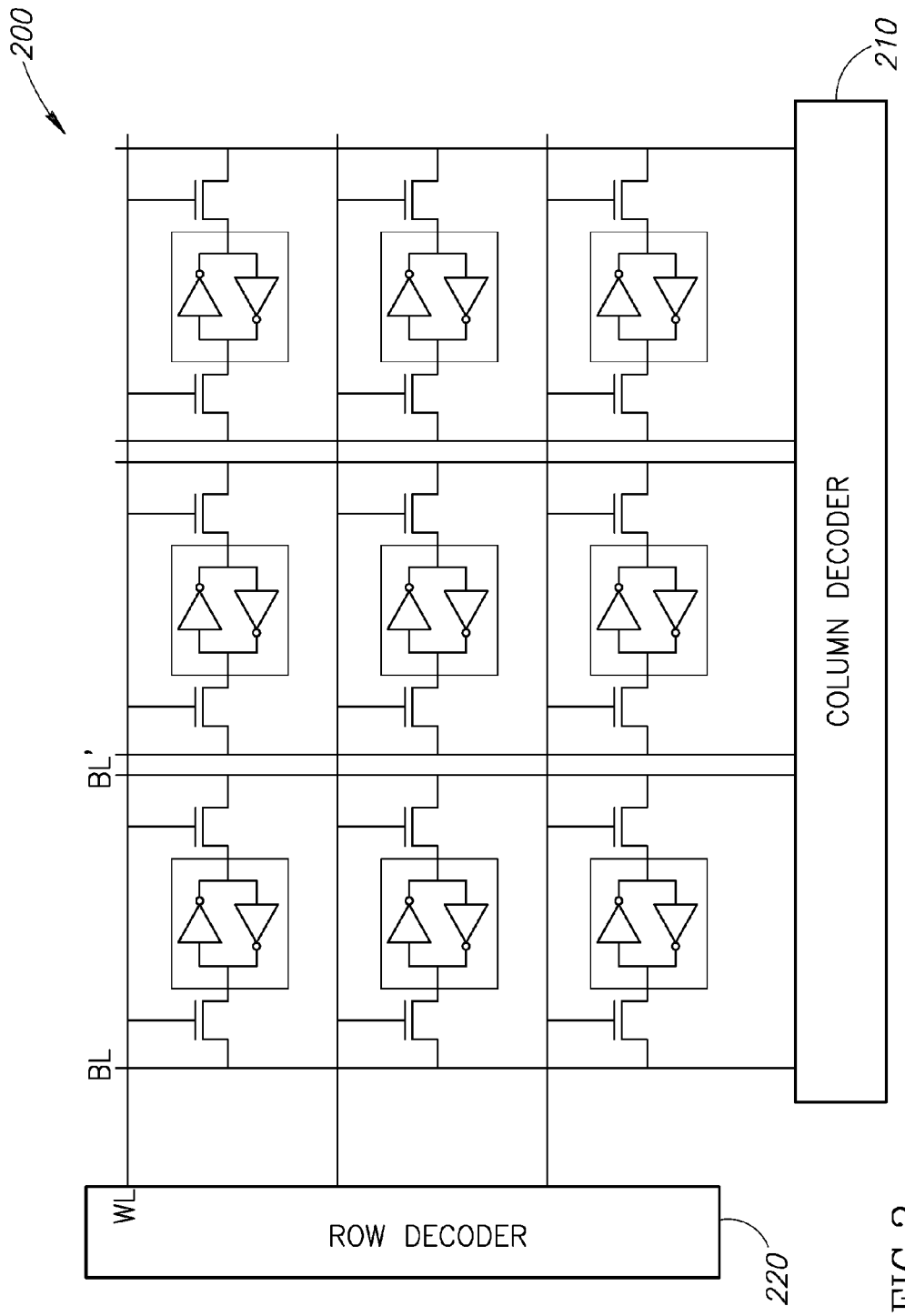
FIG. 2 is a schematic illustration of an SRAM memory array.

Reference is now made to FIG. 1, which illustrates a standard 6T SRAM memory cell 100 composed of six transistors, and to FIG. 2 which illustrates a memory array 200 of multiple 6T SRAMs 100.

Four transistors (not shown in the figure for simplicity) of 6T SRAM cell 100 form a simple standard flip-flop element 102 that has two stable voltage states which are defined as the logical "0" and "1" states. Typically, a high voltage value defines the logical "1" and a low voltage value defines the logical "0". The cell externalizes its stored value via the data signal Q and its complementary value via the data signal Q'. Thus if cell 100 stores the value "1", the voltage value in data signal Q reflects the value of "1" and the voltage value in complementary data signal Q' reflects the value of "0".

Two bit lines, BL and BL', are used to transfer data to and from the cell for read and write operations. The bit lines BL and BL' are connected to flip-flop 102 via two transistors N1 and N2, respectively, controlling access to the cell.

As shown in FIG. 2, the cells in memory array 200 are arranged in a matrix. All the cells in the same column are connected to the same bit line pair BL and BL'. All the cells in the same row are connected to the same word line WL, which are connected to the access transistors N1 and N2 of each cell. The column decoder 210 controls the column selection by charging bit lines BL and BL' of the selected column with the appropriate voltage. Row decoder 220 controls the row selection by charging word line WL to high. The selected cell for the operation is the cell that resides at the intersection of word line WL and the bit line pair BL and BL'.

When row decoder 220 selects a word line WL, cell 100 is connected to its bit lines BL and BL' and may be accessed for read or write operations. When word line WL is not selected, bit lines BL and BL' may not be connected to cell 100 and thus, may not convey the cell content or write data into the cell.

To read the state of 6T SRAM cell 100, column decoder 210 pre-charges both bit lines BL and BL' to a high voltage level after which row decoder 220 activates its word line WL. Once word line WL is activated, the voltage levels of data signals Q and Q' will affect bit lines BL and BL', respectively. The content of the cell is determined according to the voltage values of bit lines BL and BL'. If the value of data signal Q is low, the voltage value of BL, which was pre-charged to a high value, will decrease as a result of connecting to data signal Q, since Q is low. If the value of data signal Q is high, the voltage value of bit line BL will remain high. The same logic applies also to complementary data signal Q' and bit line BL'. If the value of data signal Q' is low, the voltage value of bit line BL' will decrease as a result of connecting to data signal Q'. If the value of data signal Q' is high, the voltage value of bit line BL' will remain high. At steady state, one of the bit line pair BL and BL' will decrease while the other will remain high, since data signals Q and Q' are complementary.

During the read operation, the values of bit lines BL and BL' are compared and if the levels of bit line BL is higher than the level of bit line BL', then cell 100 is said to store the value "1" and if the level of bit line BL is lower than the level of bit line BL', then cell 100 is said to store the value "0".

To write a value to the 6T SRAM cell 100, column decoder 210 charges bit line BL to a voltage level associated with the value to be written and bit line BL' to the complementary voltage level. In particular, to store the value "1" in cell 100, bit line BL is charged to a high voltage level and bit line BL' is charged at a low voltage level and, to store the value "0" in cell 100, bit line BL is charged at a low voltage level and bit line BL' is charged to a high voltage level. In order to perform the write operation, word line WL is activated and the voltage level on bit line BL is transferred to data signal Q and the voltage level of bit line BL' is transferred to data signal Q'. Accordingly, flip-flop 102 is stable in this state.

Applicant has realized that, when multiple word lines are activated at the same time, the voltage levels of the bit line pair connecting the cells in the multiple rows are affected by the data signals of all selected cells connected to the bit lines. In particular, Applicant has realized that, when the bit lines BL and BL' are precharged prior to reading, if a data signal of an activated cell connected to a bit line is low, it will pull down the voltage level of the entire bit line connecting all activated cells. Only when the data signals of all selected cells connected to a bit line are high will the voltage level of the bit line remain high. Applicant has realized that, in fact, the voltage level of a bit line connecting several selected cells reflect the result of the Boolean operations "AND" and "NOR" performed on the values stored in all selected cells.

In addition, the resultant voltage levels on the two bit lines are no longer complementary as in a standard 6T SRAM memory array. They may have the same voltage level. This is shown in FIG. 3, to which reference is now made.

Figure 3:
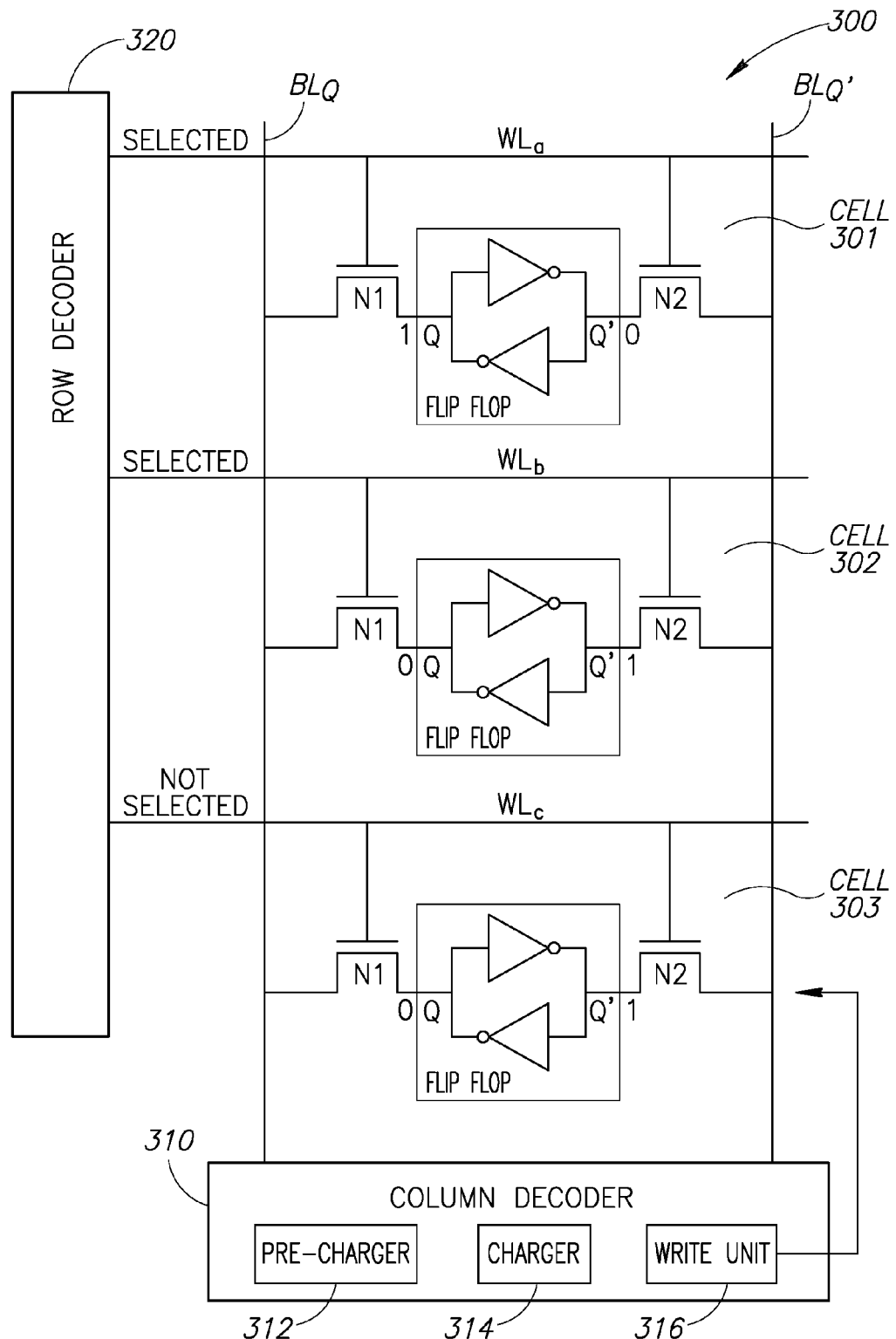
FIG. 3 is a schematic illustration of a memory computation operation in an SRAM memory array, constructed and operative in accordance with a preferred embodiment of the present invention.

FIG. 3 shows a memory array 300 comprising multiple cells, of which three cells 301, 302 and 303 are shown, a column decoder 310 and a row decoder 320. Column decoder 310 may comprise a pre-charger 312, a charger 314 and a write unit 316.

In FIG. 3, two word lines, WLa and WLb, are activated simultaneously by row decoder 320 and the bit lines, here labeled $BL_Q$ and $BL_{Q'}$, are precharged by pre-charger 312 to a fixed voltage level. As mentioned hereinabove, the voltage levels on the bit lines $BL_Q$ and $BL_{Q'}$ are influenced by the voltage level of the data signal of each selected cell in the column. In FIG. 3, the voltage level of data signal Q of cell 301 represents the logical value "1" while the voltage level of data signal Q of cell 302 represents the logical value "0". Thus, the voltage level of complementary data signal Q' of cell 301 represents the logical value "0" while the voltage level of complementary data signal Q' of cell 302 represents the logical value "1".

The resultant voltage level on bit line $BL_Q$, connecting the data signal Q of cells 301 and 302, will be low, which reflects the Boolean "AND" of data signal Q of cells 301 and 302. In addition, it also reflects the Boolean "NOR" of the complementary data signal Q' of cells 301 and 302. Thus, the resultant voltage level on bit line $BL_Q$ reflects AND(Q) and NOR(Q').

Similarly, the voltage level on bit line $BL_{Q'}$, connecting complementary data signal Q' of cells 301 and 302, reflects the Boolean "AND" of complementary data signal Q', and the Boolean "NOR" of data signal Q, namely: AND(Q') and NOR(Q).

It will be appreciated that any type of logic is possible with the present invention, depending on how the signals Q are defined. For example, if we define "0" as "True" and "1" as "False", the resultant voltage level on bit line $BL_Q$ reflects NAND(Q).

As Boolean algebra supports the associative property, it is possible to associate group variables together without altering the truth of the equations; thus, the values reflected on the bit lines $BL_Q$ and $BL_{Q'}$ are the result of the Boolean operation regardless of the number of selected cells.

Applicant has realized that since the voltage level of both bit lines, $BL_Q$ and $BL_{Q'}$, may be read simultaneously, the computation time for an operation may be reduced by 50% as a single computation cycle provides the results of two distinct Boolean operations, one result reflected on $BL_Q$ and the other on $BL_{Q'}$.

Reference is now made to FIG. 4, which is a table giving exemplary values of data stored in a 6T SRAM memory array. The memory array has 6 rows labeled 1-6 and 3 columns, labeled Col-1, Col-2 and Col-3. In the table, each cell has its data signals Q and Q' listed.

All the cells in Col-1 are connected to the same bit line pair $BL_Q$ and $BL_{Q'}$. Some cells in Col-1 have a data signal Q of "1" (the cells in rows 1, 2 and 5) and others have a data signal Q of "0" (the cells in rows 3, 4 and 6). Q' has the complementary values.

The table shows that the resultant value on bit line $BL_Q$ of Col-1 is "0" as there is at least one cell in column Col-1 whose Q value is low and that low value pulls down the whole bit line. The table also shows that the resultant value on bit line $BL_{Q'}$ of Col-1 is also "0" as there is at least one cell in column Col-1 whose Q' value is low and that low value pulls down the whole bit line. Thus, the value on bit line BL may be AND(Q). Another way to look at it is NOR(Q').

In the second column Col-2, the values of all of the data signals Q are "0". The value of its $BL_Q$ thus is "0" as there is at least one cell with a low value. However, the value of its $BL_{Q'}$ is "1", since the values of all of the complementary data signals Q' are high.

All of the cells in the third column Col-3 store a "1". The value of bit line $BL_Q$ is thus, "1", and the value of bit line $BL_{Q'}$ is "0" for the same reasons elaborated above.

In accordance with a preferred embodiment of the present invention, write unit 316 in column decoder 310 (FIG. 3) may directly write the result of the bit line back into one of cells, for example into cell 303, of memory array 300. Applicant has realized that it is also possible to write values to several cells concurrently throughout the SRAM array, by selecting several rows as described hereinabove. For the multiple write operation, column decoder 310 may instruct charger 314 to charge the bit line pairs $BL_Q$ and $BL_{Q'}$ for the columns of the cells to be written to the appropriate values to be written and may instruct pre-charger 312 to pre-charge the bit line pairs $BL_Q$ and $BL_{Q'}$ of all columns that should not be written. Pre-charging both bit lines $BL_Q$ and $BL_{Q'}$ of a column may prevent the cell from being written since the flip-flop cannot stabilize on a new state when both its bit lines are high.

Figure 5:
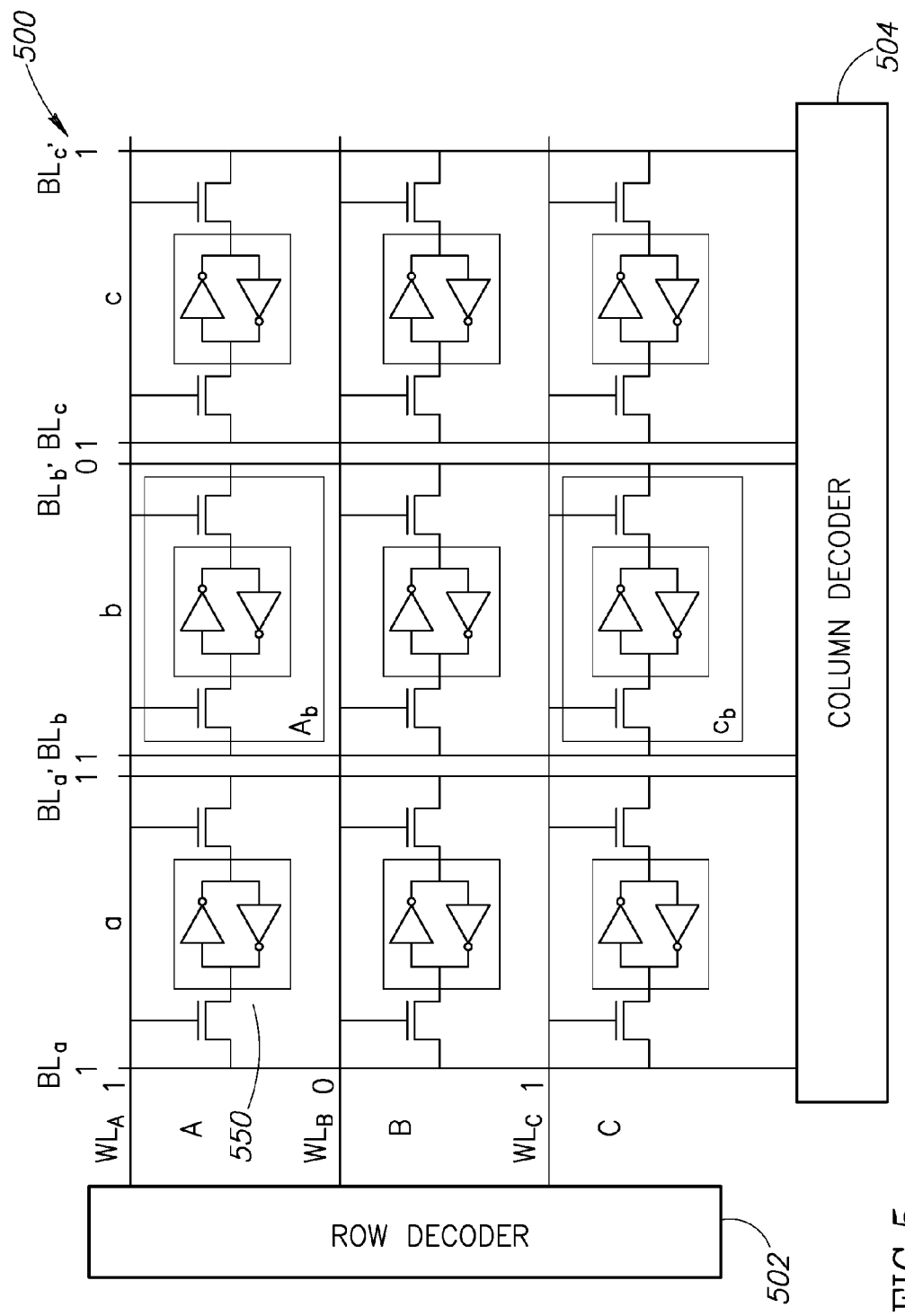
FIG. 5 is a schematic illustration of a multi cell write operation in an SRAM memory array.

Reference is now made to FIG. 5, which is an example of a small memory array 500 comprised of 3 rows and 3 columns—with a total of 9 memory cells. The array of FIG. 5 is an example only; any sized array may operate using the same principles described herein. To facilitate the understanding of the write operation described below, the three rows of the memory array 500 in FIG. 5 are marked with capital letters, as A, B and C while the columns of memory array 500 are marked with small letters, as a, b and c and each cell in the array may be referenced by its row and column marks. Memory array 500 also comprises a row decoder 502, to activate multiple rows, and a column decoder 504 to charge and pre-charge multiple columns.

In FIG. 5, in order to write the value "1" only to cells 'Ab' (cell in row 'A' column 'b') and 'Cb' (cell in row 'C' column 'b'), memory array 500 may perform the following operations: Row decoder 502 may select word lines $WL_A$ and $WL_C$ controlling rows A and C respectively. Column decoder 504 may pre-charge the bit lines of the columns that should not be written, column 'a' and column 'c' ($BL_a$, $BL'_a$, $BL_c$ and $BL'_c$). Furthermore, column decoder 504 may charge the bit lines of column b with the desired value (i.e. $BL_b$ may be charged with "1" and $BL'_b$ may be charged with "0").

In this example, the value 1 is provided only to cells in column 'b' in rows 'A' and 'C' as desired. All other cells in array 500 are not changed.

Applicant has realized that a full array may be written in merely two cycles using the write method described herein. In one embodiment, the array is nullified in the first cycle and the value "1" is written in the second cycle to all cells that should be set to "1". In another embodiment, the value "1" is written to the cells that should have the value "1" and on the second cycle a multi write operation for writing the value "0" on the other cells is performed.

Applicant has realized that the two operations may be implemented together.

It is well known that any circuit or logic may be built from a NOR gate, as it is a functionally complete operation, and thus any Boolean operation may be computed using the multi-row selection operation described hereinabove. To implement any other operation, the signal on the bit lines ($BL_Q$ or $BL_{Q'}$), which is the output of the NOR gate, may be written into separate locations of the SRAM array and may be used as input to further NOR gates, thereby implementing other Boolean operations.

Figure 6:
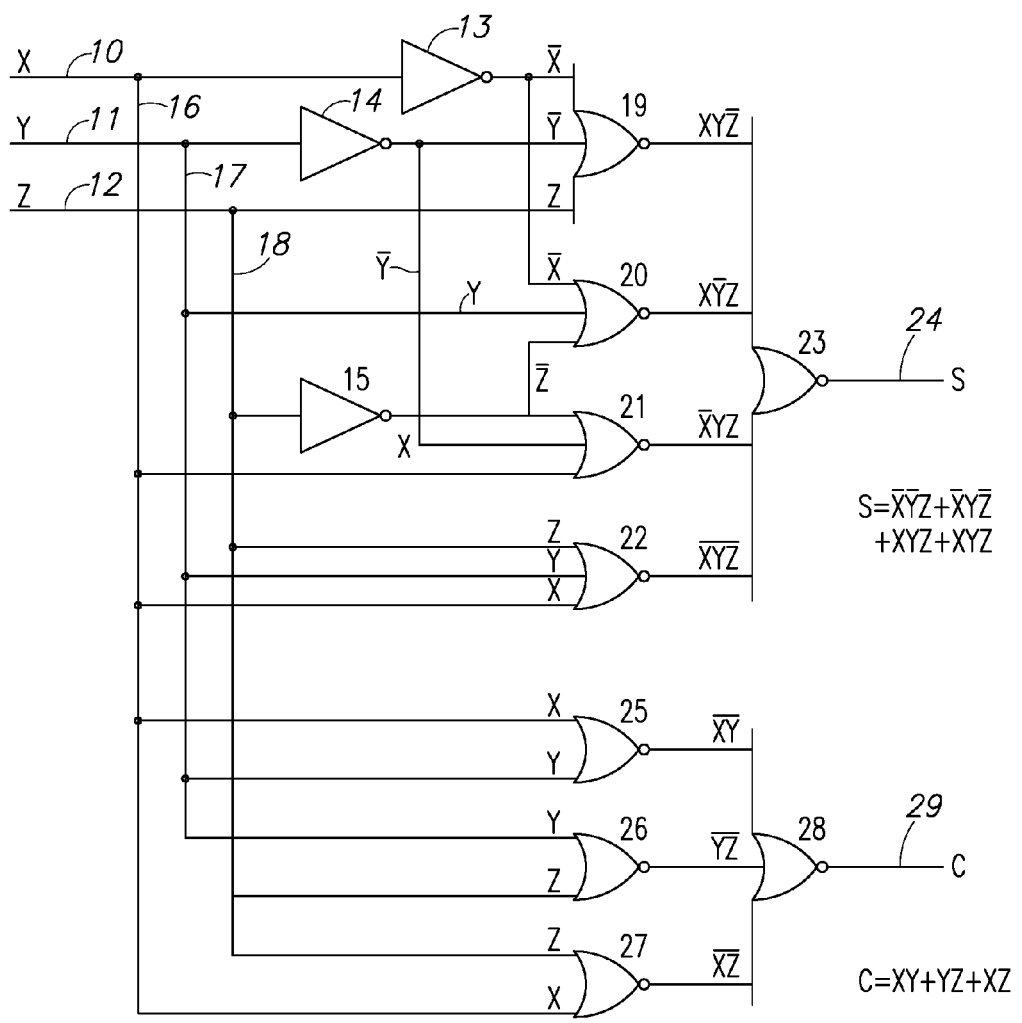
FIG. 6 is a circuit diagram illustration of a prior art full adder circuit.

For example, a full adder may be implemented using the present invention. FIG. 6, to which reference is now made, shows a full adder circuit, as designed with logic gates, while FIG. 7, to which reference is now also made, shows how to implement the same calculation with the present invention.

In the full adder circuit of FIG. 6, there are two inputs, X and Y, and a carry signal Z. Inverters 13, 14 and 15 invert the signals X, Y and Z to produce their complement signals, X_bar, Y_bar and Z_bar. Gates 19-22 each combine three of the six signals to generate interim signals XYZ_bar, XY_barZ, X_barYZ and X_barY_barZ_bar. Gates 25-27 each inverts the combination of two signals to produce X_barY_bar, Y_barZ_bar and X_barZ_bar. Finally, gate 23 produces the sum of X and Y from the combined output of gates 19-22 and gate 28 produces the output carry value C from the combined output of gates 25-27.

Figure 7:
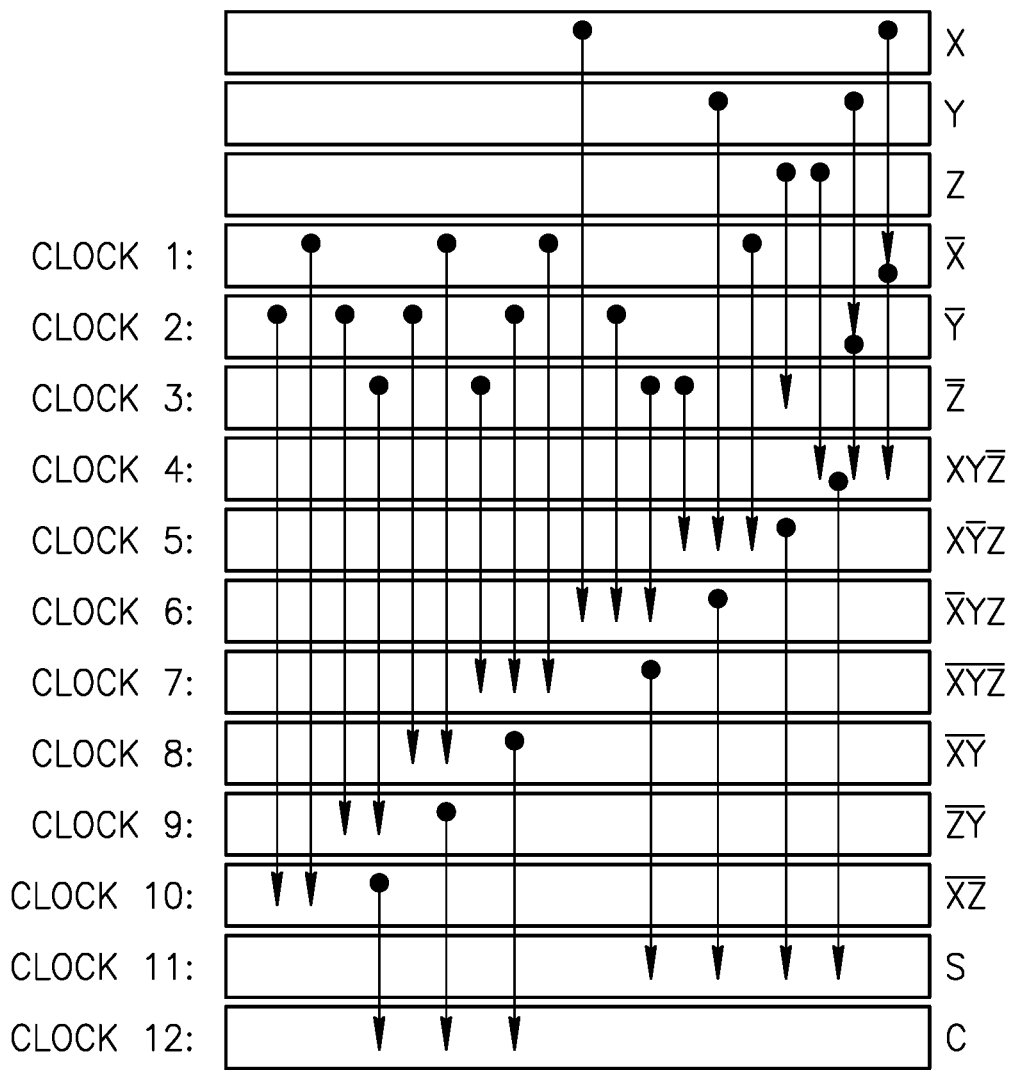
FIG. 7 is a schematic illustration of a full adder operation using the present invention.

FIG. 7 shows the values stored in various cells of memory array 300. Three initial cells store the two inputs, X and Y, and the carry signal Z. In each of the first three cycles, the complement signals of the initial cells are read to generate and store the complement signals, X_bar, Y_bar and Z_bar in three other cells (the arrows in FIG. 7 end in the cycle in which they occur and start in the memory cell of the data being utilized for the calculation).

In each of the next four cycles, a different three of these six memory cells are activated and the results are written into different cells of memory array 300 to generate interim signals XYZ_bar, XY_barZ, X_barYZ and X_barY_barZ_bar.

In the next three cycles, a different two of the complement memory cells are activated to produce and store X_barY_bar, Y_barZ_bar and X_barZ_bar. Finally, in the final two cycles, the sum S of X and Y is produced by activating the cells storing interim signals XYZ_bar, XY_barZ, X_barYZ and X_barY_barZ_bar and the output carry value C is produced by activating the cells storing the interim signals X_barY_bar, Y_barZ_bar and X_barZ_bar. Sum S and output carry C are then written back into memory array 300.

Applicant has also realized that the selective write described hereinabove may be utilized in many ways. For example, it may be utilized to update data found in a search operation, such as the TCAM search discussed in Applicant's copending application, US Publication No. 2012/0137060, entitled "TCAM SEARCH UNIT INCLUDING A DISTRIBUTOR TCAM AND DRAM AND A METHOD FOR DIVIDING A DATABASE OF TCAM RULES", published on May 31, 2012 and assigned to the common assignee of the present invention. A large database stored in a memory array may be searched to find all the cells having a particular value, or not matching a particular input value. The values stored in the cells found in the search may then be written with new values. In this manner, faulty cells may be found.

Multiplication may also be performed in this manner. The search may look for all "bytes" (groups of cells) having a particular value, for example, having a value of 6. The selective write may then rewrite the values stored in the cells to be 36, thereby providing a quick way to perform a square operation on a large database.

Applicant has realized that, with the present invention, different columns may be read and written in the same cycle. Recall that, during the write operation, the bit line pairs in the columns to be written may be charged to the appropriate voltages for the values to be written and the bit line pairs BL and BL' of all columns that should not be written are pre-charged since the flip-flop cannot stabilize on a new state when both its bit lines are high. However, as applicant has realized, the pre-charging of the non-written columns leaves the non-written columns ready for reading and thus, these columns may be read at the same time that the other columns are being written.

It will be appreciated that the operations described herein for a 6T SRAM may be implemented on any non-destructive or non-volatile memory array which has two bit lines per column, and wherein one bit line is associated with the stored charge and the other bit line is associated with the complementary value to the stored charge.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A multi-memory cell operator comprising:
   a non-destructive memory array which stores data, said array having first and second bit lines per column;
   an activation unit to activate at least two cells in a column of said memory array at the same time thereby to generate multiple Boolean function outputs of said data and of complementary data of said at least two cells on said first bit line and different multiple Boolean function outputs of said data and of said complementary data on said second bit line; and
   a multiple column decoder at least to activate said first and second bit lines of multiple selected columns for reading or writing.

2. The multi-memory cell operator of claim 1 and wherein said multiple column decoder also comprises a write unit to write the output of said first bit line, said second bit line or both bit lines of said selected columns into said memory array.

3. The multi-memory cell operator of claim 2 and wherein said multiple column decoder also comprises a calculator to perform in-memory calculations through multiple read operations and through writing the read results to other locations in said memory array, said results being used for later calculations.

4. The multi-memory cell operator of claim 1 and wherein said multiple column decoder comprises a pre-charger to precharge said first and second bit lines to a pre-defined pre-charge voltage prior to reading.

5. The multi-memory cell operator of claim 1 and wherein said multiple column decoder comprises a charger to charge said first bit line of selected columns with a state value and said second bit line with a complementary value to said state value of selected columns for writing said state value to activated cells in said selected column and a pre-charger to precharge said first and second bit lines of non-selected columns to a pre-defined pre-charge voltage during writing.

6. The multi-memory cell operator of claim 5 and wherein said multiple column decoder comprises an output unit to output the values on one or both of said first and second bit lines of selected said non-selected columns for reading during said writing.

7. The multi-memory cell operator of claim 1 and also comprising a search unit to search through said data for cells having matched values to input values, to perform an operation on said matched values to generate processed values and to write said processed values back to their associated said cells.

8. The multi-memory cell operator of claim 1 and wherein said cells are SRAM (Static Random Access Memory) cells.

9. The multi-memory cell operator of claim 1 and wherein said cells are 6 transistor SRAM cells.

10. The multi-memory cell operator of claim 1 and wherein said Boolean operations are NOR, NAND, AND and OR.

11. A method for operating a memory array for computations, the method comprising:
at the same time, activating at least two cells in a column of a non-destructive memory array having first and second bit lines per column thereby to generate multiple Boolean function outputs of data stored in said at least two cells and of complementary data of said at least two cells on said first bit line and different multiple Boolean function outputs of said data and of said complementary data on said second bit line; and
activating said first and second bit lines of multiple selected columns for reading or writing.

12. The method of claim 11 and wherein said second activating also comprises writing the output of said first bit line, said second bit line or both bit lines of said selected columns into said memory array.

13. The method of claim 12 and wherein said second activating also comprises performing in-memory calculations through multiple read operations and through writing the read results to other locations in said memory array, said results being used for later calculations.

14. The method of claim 11 and wherein said second activating comprises precharging said first and second bit lines to a pre-defined pre-charge voltage prior to reading.

15. The method of claim 11 and wherein said second activating comprises charging said first bit line of selected columns with a state value and said second bit line with a complementary value to said state value of selected columns for writing said state value to activated cells in said selected column and precharging said first and second bit lines of non-selected columns to a pre-defined pre-charge voltage during writing.

16. The method of claim 15 and wherein said second activating comprises outputting the values on one or both of said first and second bit lines of selected said non-selected columns for reading during said writing.

17. The method of claim 11 and also comprising searching through said data for cells having matched values to input values, performing an operation on said matched values to generate processed values and writing said processed values back to their associated said cells.

18. The method of claim 11 and wherein said cells are SRAM cells.

19. The method of claim 11 and wherein said cells are 6 transistor SRAM cells.

20. The method of claim 11 and wherein said Boolean operations are NOR, NAND, AND and OR.

* * * * *